(12) United States Patent
Xu

(10) Patent No.: US 8,056,827 B2
(45) Date of Patent: Nov. 15, 2011

(54) JET DISPENSER COMPRISING MAGNETOSTRICTIVE ACTUATOR

(75) Inventor: Wenbin Xu, Hong Kong (HK)

(73) Assignee: ASM Assembly Automation Ltd, Hong Kong (HK)

( * ) Notice: Subject to any disclaimer, the term of this patent is extended or adjusted under 35 U.S.C. 154(b) by 497 days.

(21) Appl. No.: 11/858,482

(22) Filed: Sep. 20, 2007

(65) Prior Publication Data

US 2009/0078787 A1  Mar. 26, 2009

(51) Int. Cl.
*B05B 1/08* (2006.01)
(52) U.S. Cl. .............. 239/102.1; 239/102.2; 239/152; 222/504; 222/511; 165/169; 165/80.1
(58) Field of Classification Search .............. 239/102.1, 239/102.2, 152; 222/504, 511; 165/169, 165/80.1
See application file for complete search history.

(56) References Cited

U.S. PATENT DOCUMENTS

| | | | | |
|---|---|---|---|---|
| 3,243,013 A | * | 3/1966 | Molin et al. .............. 184/14 |
| 3,329,347 A | * | 7/1967 | Montgomery ............. 239/583 |
| 3,921,670 A | * | 11/1975 | Clippard et al. ......... 137/625.65 |
| 4,845,450 A | * | 7/1989 | Porzio et al. ............. 335/215 |
| 5,022,629 A | * | 6/1991 | Tibbals, Jr. ............. 251/129.02 |
| 5,093,645 A | * | 3/1992 | Dorri et al. ............. 335/216 |
| 5,299,425 A | * | 4/1994 | Hingst ................. 62/51.1 |
| 5,558,504 A | | 9/1996 | Stridsberg ............. 417/322 |
| 5,585,772 A | * | 12/1996 | Joshi et al. ............. 335/215 |
| 5,703,553 A | * | 12/1997 | Bushko et al. ........... 335/215 |
| 5,731,881 A | * | 3/1998 | Buechler ............... 358/3.32 |
| 5,747,102 A | | 5/1998 | Smith et al. ............. 427/96 |
| 6,032,832 A | * | 3/2000 | Dority et al. ............. 222/214 |
| 6,393,921 B1 | * | 5/2002 | Grimes et al. ........... 73/728 |
| 6,508,196 B1 | | 1/2003 | Hansson et al. ......... 118/300 |
| 6,558,127 B2 | * | 5/2003 | Maruyama et al. ........ 417/44.1 |
| 7,296,707 B2 | * | 11/2007 | Raines et al. ............ 222/54 |
| 2005/0230438 A1 | * | 10/2005 | Saidman ............... 222/504 |
| 2006/0093493 A1 | * | 5/2006 | Maruyama et al. ....... 417/410.5 |
| 2006/0157517 A1 | * | 7/2006 | Fiske et al. ............. 222/504 |
| 2008/0079520 A1 | * | 4/2008 | Vranish .............. 335/207 |

FOREIGN PATENT DOCUMENTS

CN   201075848   *  6/2008

OTHER PUBLICATIONS

Epoxy NPL.*
Translation of CN 201075848.*

* cited by examiner

*Primary Examiner* — Len Tran
*Assistant Examiner* — Trevor E McGraw
(74) *Attorney, Agent, or Firm* — Ostrolenk Faber LLP

(57) ABSTRACT

A jet dispenser is provided with a giant magnetostrictive actuator which expands or contracts in response to electric currents. A set of flexural elements is coupled to first and second ends of the giant magnetostrictive actuator and flexes when the giant magnetostrictive actuator expands or contracts. The jet dispenser further comprises a chamber containing fluid and the fluid is dispensable through a nozzle which is in communication with the chamber. A piston coupled to the set of flexural elements is slidably located in the chamber and is actuable by flexion of the flexural elements to apply a force against the fluid for dispensing fluid through the nozzle.

13 Claims, 5 Drawing Sheets

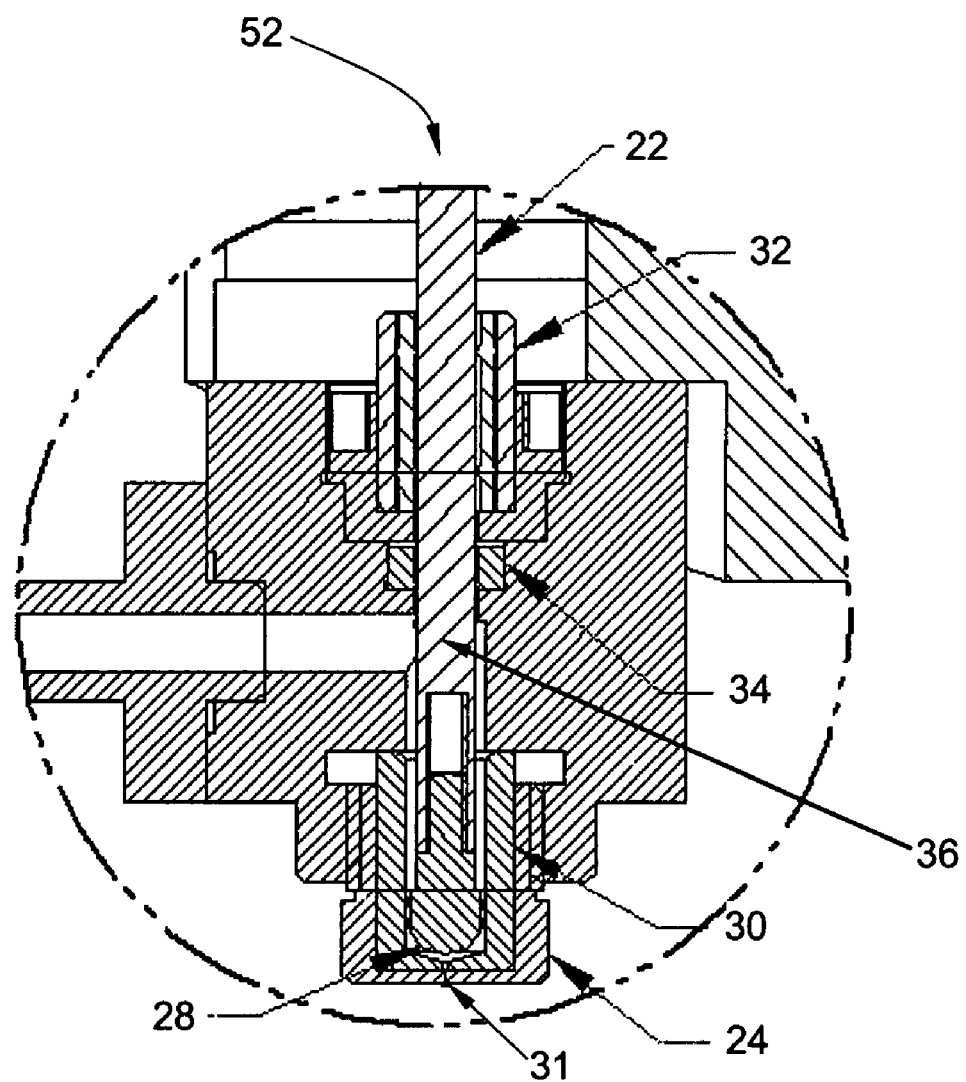
FIG. 2
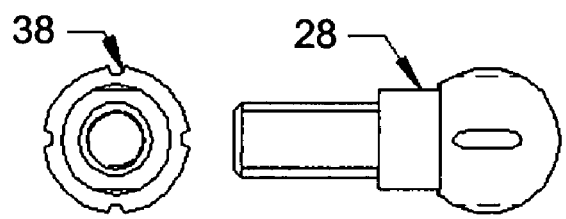
FIG. 3A    FIG. 3B

JET DISPENSER COMPRISING MAGNETOSTRICTIVE ACTUATOR

FIELD OF THE INVENTION

The present invention relates to a jet dispenser for dispensing fluid material, and in particular, to dispensing fluids having high viscosity.

BACKGROUND AND PRIOR ART

In the semiconductor industry, dispensing systems are commonly used for dispensing finite volumes of fluid material. Dispensing systems are deployed in applications such as underfill, encapsulation, supplying adhesives and die attachment.

One conventional method of dispensing uses syringe dispensers which apply time pressure dispensing or dispensing using volumetric valves. A disadvantage of using a syringe dispenser is the problem of stringing or sticking of a bead of the fluid material to a nozzle, which adversely affects the ability of the delivery system to dispense precise, quantitative amounts of fluid material. Stringing is likely to occur at lower pressures, such as when the pressure in the syringe is ramping up or ramping down. For the same reason, stringing also occurs frequently as dispensing time gets shorter.

Jet dispensers may overcome the problem of stringing. In jet dispensing, pressure is generated to act on finite volumes of fluids so that the fluids can be ejected at a high outflow velocity before being stopped with high deceleration. A droplet is then formed and dropped onto a substrate. A single or a continuous stream of micro-droplets from the nozzles can be dispensed in this manner. As nozzles of the jet dispensers do not contact the substrates during jet dispensing, stringing does not occur. This improves reliability and repeatability of dispensing. Jet dispensers may also allow for dispensing finite volumes of fluids with high accuracy. Further, dispensing with jet dispensers is faster since the dispensers do not have to raise their nozzles to break up fluid filaments. Therefore, jet dispensing provides greater flexibility for varied applications.

Jet dispensing can be conducted using actuators which produce thermal pulse, impact force or pressure waves. Pressure waves may be generated by thermal ink jets, piezoelectric vibration actuated jets or mechanical jets. Thermal ink jets create nucleate boiling by heating a resistor to form a bubble on the resistor. When power is turned off, the surrounding ink cools the bubble till it collapses. The actions of forming a bubble and subsequent collapsing of the bubble have an impact on the momentum of the fluid directly above the bubble. Thermal ink jets work well with fluids of low viscosity of, for example below 30 cps.

Piezoelectric vibration actuated jets work by rapidly changing the volume of a fluid chamber to generate acoustic pressure waves. As the pressure waves propagate, the nozzle dispensing pressure will be changed between positive and negative quickly. Thus, the droplet can be formed and ejected out. This technology is limited primarily to fluids with low viscosity.

Mechanical jets use a needle piston held against a nozzle seat. The fluid in the chamber is under low pressure. Pressure is applied to lift the needle piston off the nozzle seat. After a prescribed time, the pressure is released and the needle piston plunges at a controlled rate. When the piston hits the nozzle seat, pressure of the fluid directly between the seat and the piston increases so rapidly that a jet of fluid can be extruded from the nozzle. The impact also generates a shock wave which snaps the fluid from the nozzle.

There are various ways to drive the needle piston. Spring, piezoelectric and magnetostrictive actuators are all suitable actuators to generate a quick and strong impact force. Mechanical jets create very high local pressure at the nozzle and may therefore dispense fluids of high viscosity.

One prior art which uses magnetostrictive material as an actuator is U.S. Pat. No. 5,558,504 entitled "Magnetostrictive Pump for Applying Pastes and Adhesives". In this prior art, a piston is connected to a magnetostrictive rod. The piston is displaced when the magnetostrictive rod changes in length in response to a changing magnetic field generated by an electric current flowing through a coil around the rod. Rapid dispensing can be achieved using such magnetostrictive actuators, but as the piston stroke is limited by the low strain of the giant magnetostrictive material, the outlet velocity of fluid is not high enough to dispense highly viscous fluid. Additionally, a two valves volumetric system is used in this prior art whereby an upper valve controls the supply of fluid and a lower valve maintains the volume of fluid in the fluid chamber. The action of such a two valves system affects the accuracy of the dispensing volume and the dispensing speed.

Another prior art is U.S. Pat. No. 6,508,196 entitled "Device for Applying Drops of a Fluid on a Surface" which discloses the use of a high speed piston to generate pressure waves for ejecting droplets of fluids. Unlike U.S. Pat. No. 5,558,504, this prior art does not use a two valves volumetric system. Nevertheless, this dispenser cannot dispense highly viscous fluid. Furthermore, the working distance between a nozzle and a substrate has to be less than 0.5 mm, which limits flexibility.

Yet another prior art U.S. Pat. No. 5,747,102 entitled "Method and Apparatus for Dispensing Small Amounts of Liquid Material" discloses a mechanical jet dispenser using a piston actuated by an air solenoid. This dispenser can dispense adhesives with high viscosity but the stroke motion of the piston requires manual adjustment. Furthermore, when the piston hits the nozzle seat, the impact may damage the structure and a loud noise is also produced. The system is inflexible and the parameter window is narrow. Likewise, jet dispensers actuated by electric solenoids have the same problems as dispensers actuated by air solenoids.

Therefore, it would be desirable to devise a dispensing system which is capable of dispensing fluids of high viscosity, at a high frequency and in large quantities when required.

SUMMARY OF THE INVENTION

It is thus an object of this invention to provide a jet dispensing system for dispensing highly viscous fluids which allows a dispensing piston to achieve higher efficiency and larger strokes as compared to at least some of the aforesaid prior art.

Accordingly, the invention provides a jet dispenser comprising: a giant magnetostrictive actuator which is responsive to electric currents to expand or contract; a set of flexural elements coupled to first and second ends of the giant magnetostrictive actuator such that the expansion or contraction of the giant magnetostrictive actuator flexes the flexural elements; a chamber containing fluid and a nozzle in communication with the chamber from which the fluid is dispensable; and a piston coupled to the flexural elements which is slidably located in the chamber; wherein the piston is actuable by flexion of the flexural elements to apply a dispensing force against the fluid to dispense fluid through the nozzle.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of a preferred embodiment of the invention when considered with the accompanying drawings, in which:

FIG. 2 is a sectional view of a piston fluid chamber and nozzle of the jet dispenser of FIG. 1;

FIGS. 3A and 3B are end and side views respectively of the piston head of FIG. 2;

DETAILED DESCRIPTION OF THE PREFERRED EMBODIMENT OF THE INVENTION

The preferred embodiment of the present invention will be described hereinafter with reference to the accompanying drawings.

Figure 1:
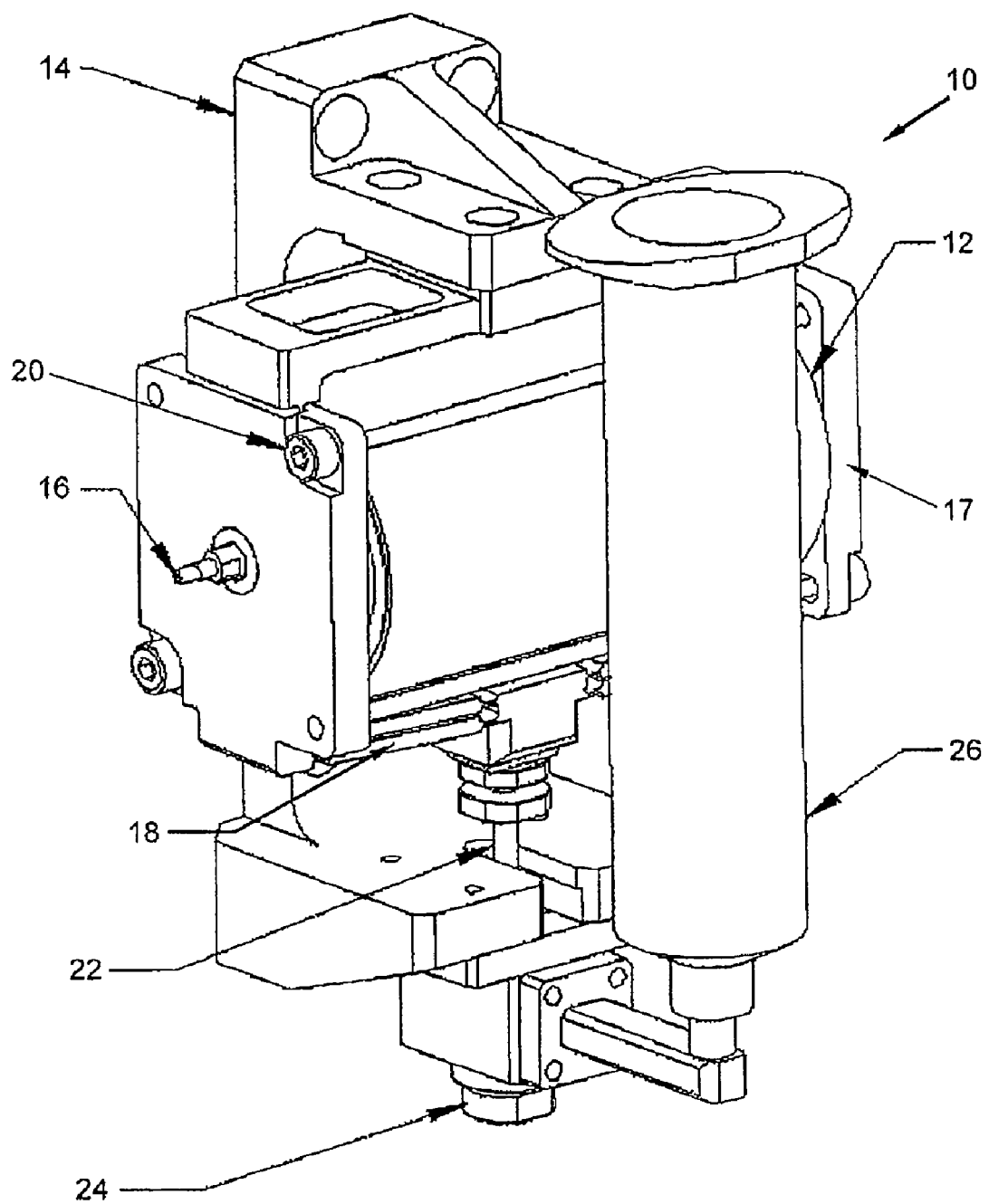
FIG. 1 is an isometric view of a jet dispenser incorporating a giant magnetostrictive actuator according to the preferred embodiment of the invention.

FIG. 1 is an isometric view of a jet dispenser 10 incorporating a giant magnetostrictive actuator 12 according to the preferred embodiment of the invention. A first set of flexural elements in the form of a flexural amplifier 18 is coupled to first and second ends of the actuator 12. A jet dispenser bracket 14 supporting the actuator 12 is coupled to the actuator 12 via a second set of flexural elements in the form of another flexural amplifier 18' that is coupled to the said first and second ends of the actuator 12. The first and second sets of flexural amplifiers 18, 18' are preferably located on opposite sides of the actuator 12. The jet dispenser 10 further includes a fluid supply 26 located next to the actuator 12. The giant magnetostrictive actuator 12 is responsive to electric currents to expand or contract. The expansion or contraction of the actuator 12 flexes the flexural amplifiers 18, 18' which are coupled to the actuator 12.

A cooling arrangement is preferably incorporated in the actuator 12 and it may comprise air cooler adapters 16, such as compressed air cooler adapters, located near said first and second ends of the actuator 12. The compressed air introduced by the compressed air cooler adapters 16 at one end of the actuator 12 enters a fluid channel traversing across the actuator 12 and emerges through an opposite end of the actuator 12.

First and second clamping plates 17 are located at the first and second ends of the actuator 12 respectively to which the flexural amplifiers 18, 18' are connected. The first and second flexural amplifiers 18, 18' are connected to the clamping plates 17 at respective top and bottom ends of the clamping plates 17. Adjustable screws 20 connect the first and second clamping plates 17 and compress the clamping plates 17 to provide a preload force against the first and second ends of the actuator 12. There are preferably four screws 20 that are located at diagonally opposite corners of each clamping plate 17.

A piston 52, comprising a piston shaft 22 and a piston head 28, is coupled to the flexural amplifier 18, which is in turn connected to the actuator 12 via the clamping plates 17. The piston shaft 22 extends from the lower end of the flexural amplifier 18, and is connected to the piston head 28 located at the vicinity of a nozzle 24 of the jet dispenser 10.

FIG. 2 is a sectional view of a piston fluid chamber 36 and nozzle 24 of the jet dispenser 10 of FIG. 1. The fluid chamber 36 contains a fluid such as epoxy. The nozzle 24 is in communication with the fluid chamber 36 and the fluid is dispensable through the nozzle 24. The piston 52 is slidably located in the fluid chamber 36 and a linear bearing guide 32 positioned adjacent a length of the piston shaft 22 guides the vertical movement of the piston 52. Since the piston 52 is coupled to the flexural amplifier 18, it is therefore actuable by flexion of the flexural amplifier 18 so as to apply a dispensing force against the fluid to dispense the fluid through the nozzle 24. A seal ring 34 which is also adjacent to the length of the piston shaft 22 seals the fluid in the fluid chamber 36.

Before dispensing the fluid, the piston head 28 is pressed against an opening 31 of the nozzle seat 30 to prevent the fluid in the fluid chamber 36 from flowing out of the opening 31. When the giant magnetostrictive actuator 12 is activated, it retracts the piston 52 upwards to a predetermined position and holds the piston shaft 22 and piston head 28 in this position away from the nozzle seat 30. The fluid in the fluid chamber 36 flows into the gap between the piston head 28 and the opening 31 of the nozzle seat 30.

The prescribed position of the piston 52 is controlled by the driving current of the giant magnetostrictive actuator 12. After an allocated time, the actuator 12 is deactivated. The piston head 28 of the piston 52 slides downwards and presses on the nozzle seat 30 assisted by the spring force of the flexural amplifier 18. This downward action generates a sufficiently high pressure by the piston head 28 on the fluid below the piston head 28 to force the fluid out of the opening 31. A continuous flow constituting a fluid filament forms. At the point when the piston head 28 hits the nozzle seat 30, the fluid filament breaks off due to the sudden deceleration. A fluid droplet is formed which is dispensed onto a substrate.

FIGS. 3A and 3B are end and side views respectively of the piston head 28 of FIG. 2. The shapes of both the piston head 28 and the nozzle seat 30 affect the operation of mechanical jet dispensers by changing the pressure in the nozzle 24 and the fluid velocity. The piston head 28 includes multiple slots 38 running down side surfaces of the piston head 28. The slots 38 are preferably parallel to the actuation directions of the piston 52 for facilitating the flow of fluid past the piston head 28 through the slots 38. For example, in FIG. 3A, four equally-spaced slots 38 are shown along the side surfaces of the piston head 28. These slots 38 aid refill of the fluid chamber 36 with the fluid from the fluid supply 26 easily and quickly when the piston 52 retracts. When the piston 52 is moving downwards, the slots 38 may further assist in damping the fluid to achieve a vertical stroke at higher velocity. The piston head 28 of the preferred embodiment of this invention has another advantage in that it is easily replaceable. A wider parameter window is therefore achievable with the piston head 28 of the preferred embodiment of this invention.

Figure 4:
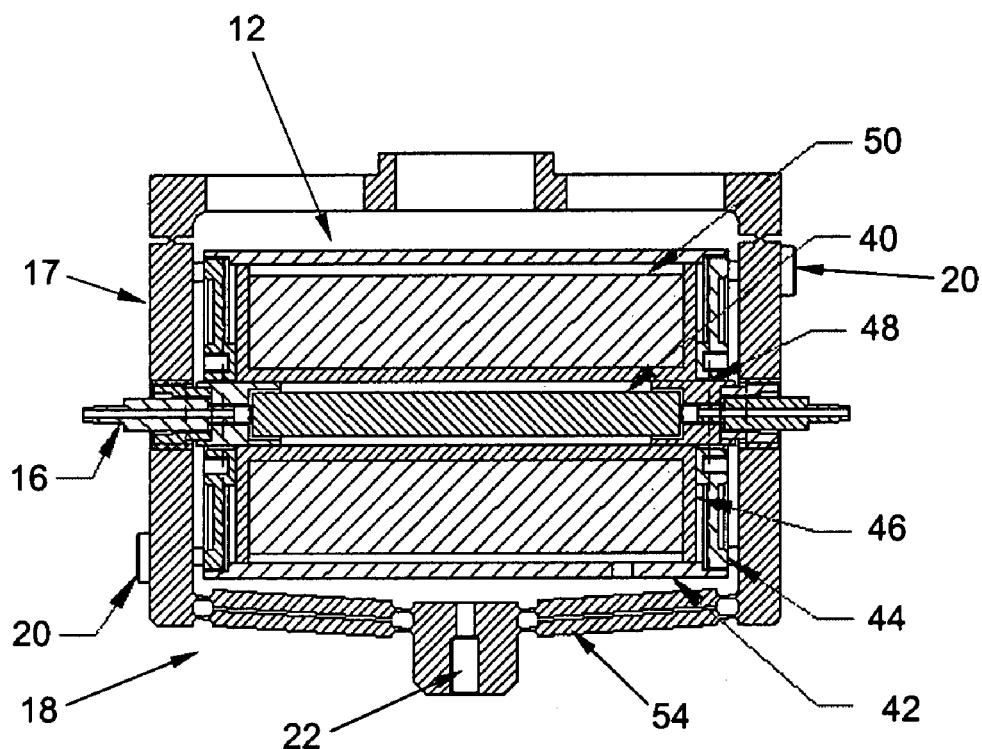
FIG. 4 is a sectional view of a giant magnetostrictive actuator of the jet dispenser of FIG. 1.

FIG. 4 is a sectional view of the giant magnetostrictive actuator 12 of the jet dispenser 10 of FIG. 1. A single symmetric flexural amplifier 18 is connected to the bottom sides of the clamping plates 17, the flexural amplifier 18 being symmetrical about a point at which the piston shaft 22 of the piston 52 is coupled. The flexural amplifier 18 further comprises a pair of symmetrically positioned diaphragms 54 which are deflectable. Deflecting these diaphragms 54 changes the position of the piston 52 and thus the position of the piston head 28. The giant magnetostrictive rod 40 of the actuator 12 traverses the actuator 12 and is clamped between the clamping plates 17. In the preferred embodiment, the giant magnetostrictive rod 40 comprises a ferromagnetic rod. Slide guides 48 are found on at least one end of the rod 40 for guiding expansion and contraction of the giant magnetostrictive rod 40. The rod 40 is surrounded by an electric coil assembly 50 and the opposite ends of the coil assembly 50 are capped by coil brackets 46. The rod 40 and coil assembly 50 are enclosed within a shell 42 and two side covers 44.

When electricity flows through the electric coil assembly 50, a magnetic field is generated around the giant magnetostrictive rod 40. The strength of the magnetic field varies with the electrical current passing through the coil assembly 50 and the magnetic field induces changes to the length of the rod 40. As the rod 40 changes in length, it moves the clamping plates 17 in outward and inward directions which in turn flexes the diaphragms 54 of the flexural amplifier 18 upwards or downwards. The deflection of the diaphragms 54 displaces the piston 52 that is coupled to it vertically in the same direction. This actuates the piston head 28 to dispense fluid as described above.

The flexural amplifier 18 significantly magnifies the vertical piston strokes actuated by the giant magnetostrictive rod 40 so that larger volumes of fluid may be dispensed with each stroke. However, heat is generated as the giant magnetostrictive rod 40 is actuated. When the temperature of the rod 40 changes, the material strain of the rod 40 also changes. Thus, the compressed air cooler adapters 16 at both ends of the rod 40 generate compressed air to dissipate the heat generated, in order to achieve a higher degree of actuation accuracy.

Figure 5:
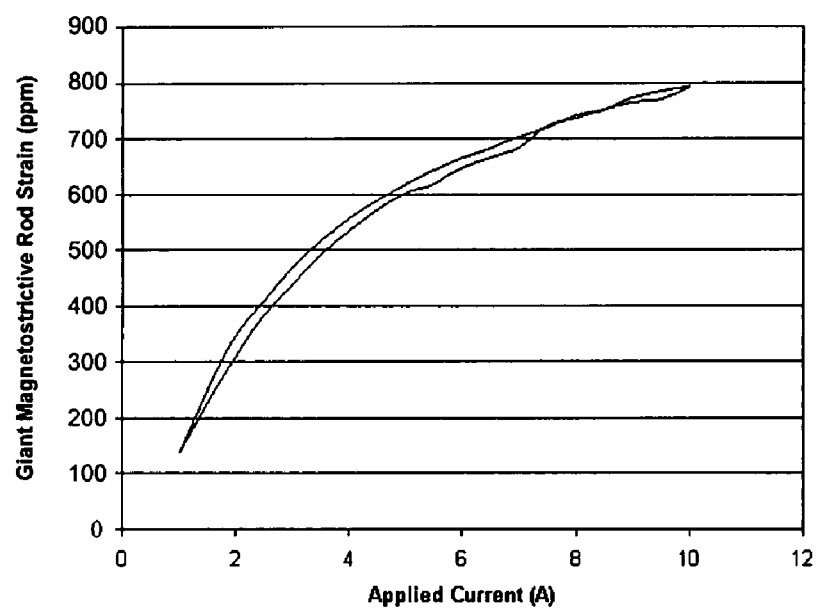
FIG. 5 is a graphical representation illustrating the effect of an applied current on the strain of the giant magnetostrictive actuator of FIG. 4.

FIG. 5 is a graphical representation illustrating the effect of an applied current on the strain of the giant magnetostrictive actuator 12 of FIG. 4. Certain ferromagnetic materials exhibit magnetostrictive property. That is, such materials undergo material strain and change shape in a magnetic field. The material strain generated is proportional to the magnetic field and the relationship between the material strain of a giant magnetostrictive rod 40 and an applied current is as follows:

$$H = N \cdot I / l$$

where H is the magnitude of a magnetic field, N is the number of turns of the electric coil assembly 50, I is the strength of the electric current through the coil assembly 50 and l is the length of the giant magnetostrictive rod 40. The degree of material strain of the rod 40 varies with the magnitude of the magnetic field H, which is in turn dependent on the strength of the electric current I in the electric coil assembly 50. A higher I generates a stronger magnetic field H, which brings about a greater material strain. The graph in FIG. 5 shows this relationship between the strength of the electric current I, and the material strain on the rod 40, which changes the length l of the rod 40. The greater the applied current (A), the greater the strain (ppm) on the rod 40.

In general, it has been found that the material strain of the rod 40 and the resulting deformation of the rod thereof, are relatively small even if the magnetic field H is strong. For example, the deformation is below 100 μm for a rod 40 which has a length of less than 60 mm. Such magnitude of deformation is insufficient for dispensing fluid with high viscosity at high pressure. It is therefore desirable to magnify the deformation of the rod in order to achieve bigger piston strokes, in particular when dispensing fluid that is highly viscous and at high pressure. Accordingly, in the preferred embodiment of the present invention, the flexural amplifier 18 exhibits an amplification coefficient of 5 to 15 to magnify the deformation of the giant magnetostrictive rod 40 so as to generate the required stroke. In other words, the flexural amplifier 18 is capable of amplifying a distance traveled by the piston by 5 to 15 times as compared to a change in the length of the actuator 12 caused by expansion or contraction.

Figure 6:
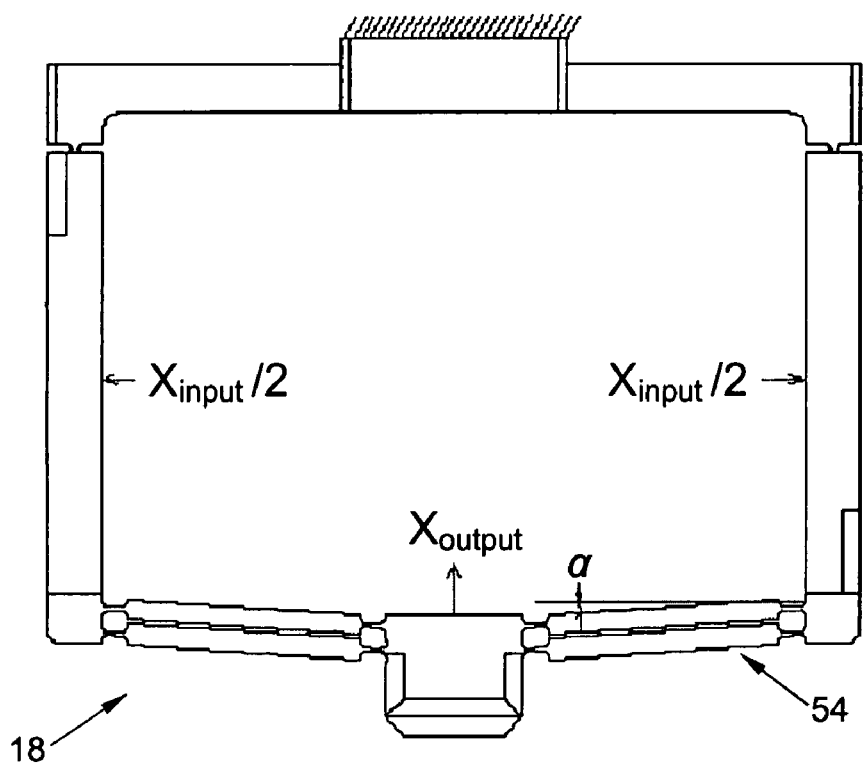
FIG. 6 is a sectional view of a single symmetric flexural amplifier connected to the giant magnetostrictive actuator of FIG. 4.

FIG. 6 is a sectional view of the single symmetric flexural amplifier 18 connected to the giant magnetostrictive actuator 12 of FIG. 4. Only one pair of diaphragms 54 is present in the single symmetric flexural amplifier 18. The diaphragms 54 are movable in the upward and downward directions and actuate a piston 52 attached to them.

$X_{input}$ is an input displacement and $X_{output}$ is an output displacement of the flexural amplifier 18. $X_{input}/2$ is the deflection of each vertical wall of the flexural amplifier 18 in the x-axis from rest brought about by changes in the length of the rod 40 under the influence of changes in the magnetic field. $X_{output}$ is the deflection of the diaphragm 54 of the flexural amplifier 18 which causes the attached piston 52 to displace vertically. The flexural amplifier 18 magnifies the action of the giant magnetostrictive actuator rod 40 so that $X_{output}$ is substantially greater than $X_{input}$, thereby producing larger vertical strokes of the piston 52 as compared to the changes to the length of the rod 40.

Figure 7:
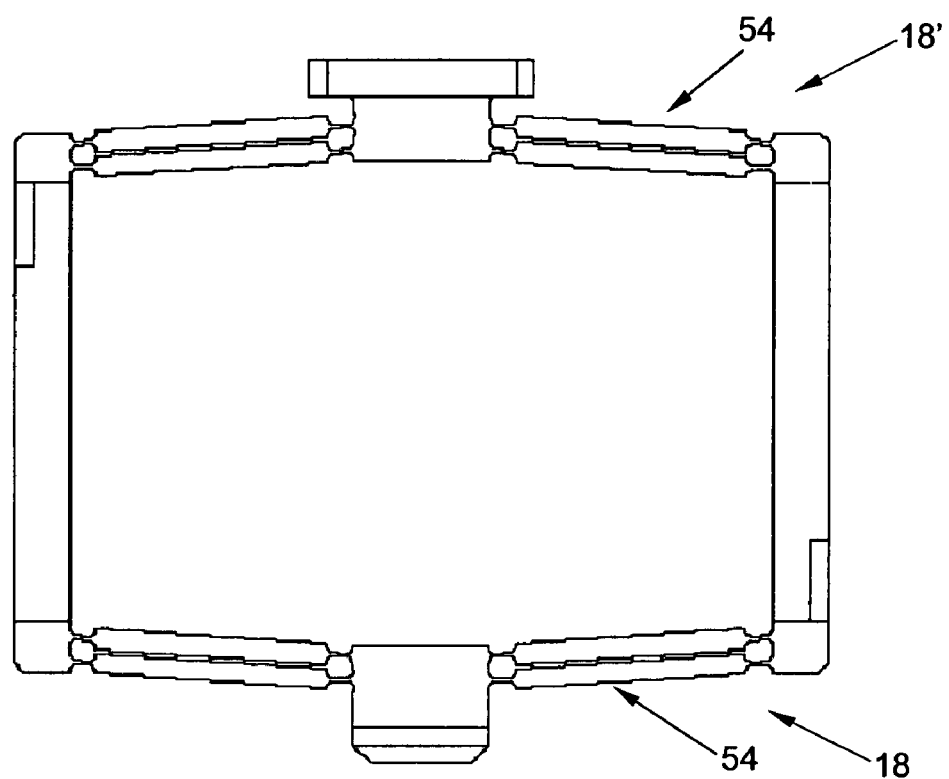
FIG. 7 is a sectional view of a double symmetric flexural amplifier connected to the giant magnetostrictive actuator of FIG. 4.

FIG. 7 is a sectional view of the double symmetric flexural amplifier 18, 18' connected to the giant magnetostrictive actuator 12 of FIG. 4. Each flexural amplifier 18, 18' comprises a pair of diaphragms 54. The resultant $X_{output}$ may be twice that of $X_{output}$ obtainable when a single symmetric flexural amplifier 18 is used. That is, correspondingly larger vertical strokes of the piston 52 may be obtained with a double symmetric flexural amplifier as compared with a single symmetric flexural amplifier.

Figure 8:
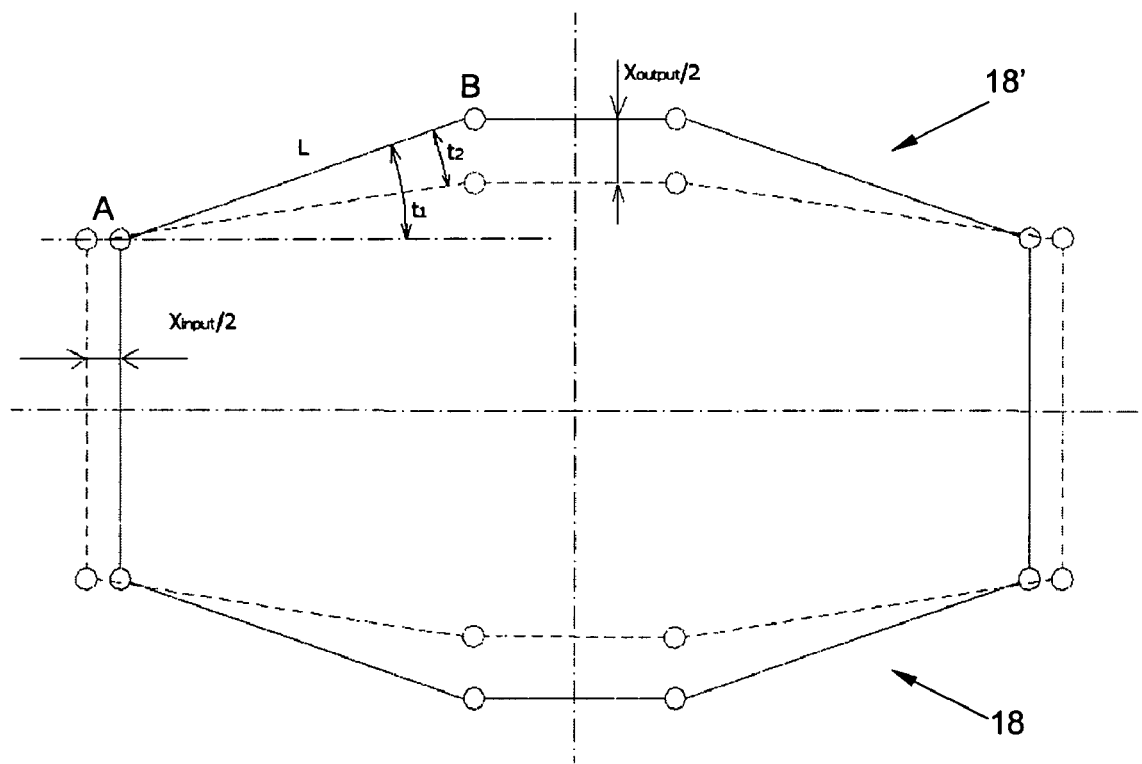
FIG. 8 is a schematic view of the double symmetric flexural amplifier of FIG. 7 illustrating the deformation of the flexural amplifier during actuation.

FIG. 8 is a schematic view of the double symmetric flexural amplifier of FIG. 7 illustrating the deformation of the flexural amplifiers 18, 18' during actuation. The principle applied in the flexural amplifiers 18, 18' is based on the theory of triangular amplification. Disregarding the deformation of the bars and joints, these equations are obtained:

$$X_{input}/2 = L \cdot (\cos(t_1 - t_2) - \cos(t_1))$$

$$X_{output}/2 = L \cdot (\sin(t_1) - \sin(t_1 - t_2))$$

where $t_1$ and $t_2$ are angles in radians and L is the length AB of a diaphragm 54 as shown in FIG. 8.

If $t_2$ is small, these assumptions may be made:

$$\sin(t_2) = t_2; \text{ and}$$

$$1 - \cos(t_2) = t_2^2/2$$

The following relationship between the input displacement, $X_{input}$, and the output displacement, $X_{output}$, is derived:

$$X_{output} = 2L \cdot \left( \sqrt{(\tan(t_1))^2 + \frac{X_{input}}{L}} - \tan(t_1) \right)$$

As an illustration, for L=28.5 mm and $t_1$=3.63°, a Displacement Amplification Ratio, $X_{output}/X_{input}$ is about 15.

The Displacement Amplification Ratio is smaller when a single symmetric flexural amplifier 18 is used. Though it has a smaller displacement amplification ratio, a single symmetric flexural amplifier 18 can achieve a higher working frequency. Hence, faster piston strokes can be executed.

It should be appreciated that the giant magnetostrictive actuated jet dispenser 10 working in conjunction with the flexural amplifier 18, 18' in accordance with the preferred embodiment of the invention improves the efficiency of the jet dispenser 10. Such a dispenser is capable of larger piston strokes which are especially significant when dispensing fluid of high viscosity. As a result, continual dispensing of highly viscous adhesives, such as silver epoxy that is commonly used in electronic packaging, is feasible at high pressure and in larger amounts.

While a giant magnetostrictive actuated jet dispenser 10 using a double symmetric flexural amplifier 18 is capable of producing larger piston strokes, a single symmetric flexural amplifier 18 is useful when faster but shorter strokes are required. Moreover, the compressed air cooler adapters 16 help to maintain the thermal stability of the giant magnetostrictive rod 40 leading to increased accuracy in dispensing fluids onto substrates. This method of jet dispensing further allows greater distance between the nozzle 24 and the substrate, such as more than 3 mm, which allows greater flexibility in dispensing. Additionally, by changing the applied current which generates magnetic field of different magnitude acting on the actuator rod 40, the volume of the fluid for dispensing is adjustable. Another advantage is that a giant magnetostrictive actuator works in a position control mode such that the stroke of piston is programmable, thereby further increasing flexibility and versatility during use.

The invention described herein is susceptible to variations, modifications and/or additions other than those specifically described and it is to be understood that the invention includes all such variations, modifications and/or additions which fall within the spirit and scope of the above description.

The invention claimed is:

1. A jet dispenser comprising:
    a giant magnetostrictive actuator operable to expand or contract responsive to electric currents, the giant magnetostrictive actuator comprising a giant magnetostrictive rod with a first and a second end, the giant magnetostrictive actuator further comprising at least two clamping plates, each clamping plate connected to one of the first and second ends of the giant magnetostrictive rod and clamping the giant magnetostrictive rod therebetween;
    a set of flexural elements disposed between the clamping plates, each flexural element having a connection portion connected to the clamping plates to couple the flexural elements to the first and second ends of the giant magnetostrictive rod such that expansion or contraction of the giant magnetostrictive rod flexes the connection portions of the flexural elements in a first direction;
    a chamber containing fluid;
    a nozzle positioned in communication with the chamber and configured to dispense the fluid;
    a piston slidably located in a chamber, the piston being attached to the flexural elements and coupled to the giant magnetostrictive rod through the flexural elements, the piston being actuable by the flexion of the flexural elements to slide in a second direction so as to apply a dispensing force against the fluid to dispense fluid through the nozzle, the second direction being substantially perpendicular to the first direction; and
    the set of flexural elements being configured to amplify a change in length of the giant magnetostrictive rod due to the expansion or contraction of the giant magnetostrictive rod so as to slide the piston in the second direction through a distance greater than that change in length of the giant magnetostrictive rod.

2. The jet dispenser as claimed in claim 1, further comprising a bracket supporting the giant magnetostrictive actuator, the bracket being coupled to the actuator via a second set of flexural elements coupled to said first and second ends of the giant magnetostrictive actuator, the set of flexural elements attached to the piston and the second set of flexural elements being located on opposite sides of the giant magnetostrictive actuator.

3. The jet dispenser as claimed in claim 1, further comprising a cooling arrangement located in the giant magnetostrictive actuator.

4. The jet dispenser as claimed in claim 3, wherein the cooling arrangement comprises:
    a fluid channel traversing across the giant magnetostrictive actuator, and
    air cooler adapters located near the first and second ends of the giant magnetostrictive rod.

5. The jet dispenser as claimed in claim 1, further comprising adjustable screws connecting the clamping plates, the adjustable screws being operable to compress the clamping plates to provide a preload force against the first and second ends of the giant magnetostrictive rod.

6. The jet dispenser as claimed in claim 1, wherein the piston further comprises a piston head including side surfaces and multiple slots running down the side surfaces, the slots being parallel to a direction of actuation of the piston to facilitate flow of the fluid past the piston head through the slots.

7. The jet dispenser as claimed in claim 1, wherein the set of flexural elements is symmetrical about a point at which the piston is coupled to the flexural elements.

8. The jet dispenser as claimed in claim 7, wherein the flexural elements further comprise a pair of symmetrically positioned deflectable diaphragms.

9. The jet dispenser as claimed in claim 1, further comprising an electric coil assembly,
    wherein the giant magnetostrictive rod is surrounded by the electric coil assembly.

10. The jet dispenser as claimed in claim 9, further comprising slide guides positioned on at least one end of the magnetostrictive rod, the slide guides being configured to guide the expansion and contraction of the magnetostrictive rod.

11. The jet dispenser as claimed in claim 1, wherein the flexural elements are configured to amplify by 5 to 15 times the change in length of the giant magnetostrictive rod due to the expansion or contraction of the giant magnetostrictive rod.

12. The jet dispenser as claimed in claim 1, wherein the fluid comprises epoxy.

13. The jet dispenser as claimed in claim 1, wherein a direction of the expansion or contraction of the giant magnetostrictive actuator flexing the flexural elements is orthogonal to a direction of actuation of the piston applying the dispensing force.

* * * * *